United States Patent
Caillat et al.

(10) Patent No.: US 6,673,996 B2
(45) Date of Patent: Jan. 6, 2004

(54) THERMOELECTRIC UNICOUPLE USED FOR POWER GENERATION

(75) Inventors: Thierry Caillat, Pasadena, CA (US);
Andrew Zoltan, Walnut, CA (US);
Leslie Zoltan, Glendora, CA (US);
Jeffrey Snyder, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/138,040

(22) Filed: May 1, 2002

(65) Prior Publication Data

US 2002/0189661 A1 Dec. 19, 2002

Related U.S. Application Data

(63) Continuation-in-part of application No. 09/765,062, filed on Jan. 17, 2001, now Pat. No. 6,563,039.
(60) Provisional application No. 60/287,862, filed on May 1, 2001.

(51) Int. Cl.$^7$ ............... H01L 35/34; H01L 35/12; H01L 35/20
(52) U.S. Cl. ............ 136/201; 136/236.1; 136/239; 136/241
(58) Field of Search ............ 136/200, 201, 136/203, 205, 236.1, 237, 239, 241; 252/62.3 T

(56) References Cited

U.S. PATENT DOCUMENTS

| | | | |
|---|---|---|---|
| 3,208,835 A | 9/1965 | Duncan et al. | 29/195 |
| 3,231,965 A | 2/1966 | Roes | 29/155.5 |
| 3,564,860 A | 2/1971 | Reich et al. | 62/3 |
| 3,650,844 A | 3/1972 | Kendall, Jr. et al. | 136/237 |
| 3,958,324 A | 5/1976 | Alais et al. | 29/573 |
| 4,922,822 A | 5/1990 | Bierschenk et al. | 136/204 |
| 5,006,178 A | 4/1991 | Bijvoets | 136/211 |
| 5,929,351 A | 7/1999 | Kusakabe et al. | 75/228 |
| 5,969,290 A | 10/1999 | Kagawa et al. | 136/201 |
| 6,069,312 A | 5/2000 | Fleurial et al. | 136/236.1 |

OTHER PUBLICATIONS

Fleurial, J.–P., Borshchevsky, A., Caillat, T., Ewell, R., R., "New materials and devices for thermoelectric applications", Energy Conversion Engineering Conference, 1997, IECEC–97. Proceedings of the 32$^{nd}$ Intersociety, Aug. 1997, pp. 1080–1085.*

Fleurial, J.–P., Caillat, T., Borshchevsky, A., "Skutterudites: an update", Thermoelectrics, 1997. Proceedings ICT '97. XVI, Aug. 1997, pp. 1–11.*

Caillat, T., Fleurial, J.–P., Snyder G.N., Zoltan, A., Soltan., Borshchebsky, A., "Development of a high efficiency thermoelectric unicouple for power generation applications", Thermoelectrics 1999. Aug. 1999, pp. 473–476.*

* cited by examiner

Primary Examiner—Patrick Ryan
Assistant Examiner—Thomas H Parsons
(74) Attorney, Agent, or Firm—Fish & Richardson P.C.

(57) ABSTRACT

A high-efficiency thermoelectric unicouple is used for power generation. The unicouple is formed with a plurality of legs, each leg formed of a plurality of segments. The legs are formed in a way that equalizes certain aspects of the different segments. Different materials are also described.

10 Claims, 3 Drawing Sheets

THERMOELECTRIC UNICOUPLE USED FOR POWER GENERATION

CROSS-REFERENCE TO RELATED APPLICATIONS

This application claims priority from provisional application No. 60/287,862, filed May 1, 2001.

This is a continuation in part of Ser. No. 09/765,062, filed Jan. 17, 2001 now U.S. Pat. No. 6,563,039.

STATEMENT REGARDING FEDERALLY-SPONSORED RESEARCH OR DEVELOPMENT

The invention described herein was made in the performance of work under a NASA 7-1407 contract and is subject to the provisions of Public Law 96-517 (U.S.C. 202) in which the contractor has elected to retain title.

BACKGROUND OF THE INVENTION

1. Field of the Invention

A high-efficiency thermoelectric unicouple is used for power generation.

2. Description of the Related Art

No single thermoelectric material has been suitable for use over a very wide range of temperatures, e.g. such as between 300 and 1000 degrees Kelvin. Prior art techniques have used different thermoelectric materials and have been limited to relatively narrow temperature ranges. Each material is used in the range where it possesses the optimum performance.

Thermoelectric generator devices can be used to create electrical energy based on temperature differentials. Many different thermoelectric materials and forms are known. It is often desirable to operate a thermoelectric generator over a large temperature gradient to increase higher thermal to electrical efficiency. For example, thermoelectric generators may be used in applications such as deep space missions, where other generators might have difficulties in operation.

No single thermoelectric material has been suitable for use over a very wide range of temperatures, e.g. such as between 300 and 1000 degrees Kelvin. Prior art techniques have used different thermoelectric materials and have been limited to relatively narrow temperature ranges. Each material is used in the range wherein possesses the optimum performance.

Generators are known which include a multistage thermoelectric generator where each state operates over a fixed temperature difference and is electrically insulated but thermally in contact with the other stages. An alternative approach uses segmented unicouples/generators, having p and n type materials, formed of different material segments but joined in series.

BRIEF SUMMARY OF THE INVENTION

The present system describes a thermoelectric generator or unicouple formed of segmented thermoelectric parts. The unicouple may be formed of special thermoelectric materials including skutterudites, Specific materials may include $Zn_4Sb_3$ materials, $CeFe_4Sb_{12}$ based alloys, both of which are p type materials. N type materials may also be used including $CoSb_3$ based alloys. Special techniques may be used to reduce the contact resistance of connection to the thermoelectric legs.

BRIEF DESCRIPTION OF THE DRAWINGS

These and other aspects will now be described in detail with reference to the accompanying drawings, wherein.

DETAILED DESCRIPTION OF THE INVENTION

Thermoelectric generators may have many different applications. As described above, thermoelectric generation can be used in radioisotope thermoelectric generators for deep space missions. It can be used for recovering energy waste heat from heat generation processes such as industrial processes or vehicle exhaust.

It is often desirable to operate such a generator over a large temperature difference to achieve high thermal to electrical efficiency values.

The present application teaches improving efficiency by forming a segmented unicouple device. The device has n type and p type legs which are segmented into segments made of different materials. The materials are selected to increase the average thermoelectric figure of merit of the legs. This allows operating the unicouple over relatively large temperature gradients.

The specific segmented unicouple uses alternating P and N type legs. The specific materials include P type materials which can include p-type $Bi_2Te_3$ based alloys and/or $Zn_4Sb_3$ or $CeFe_4Sb_{12}$ based alloys, and n type materials which can include n type $Bi_2Te_3$ based alloys and/or $CoSb_3$ based alloys. These specific materials are described in further detail in the literature.

Figure 1:
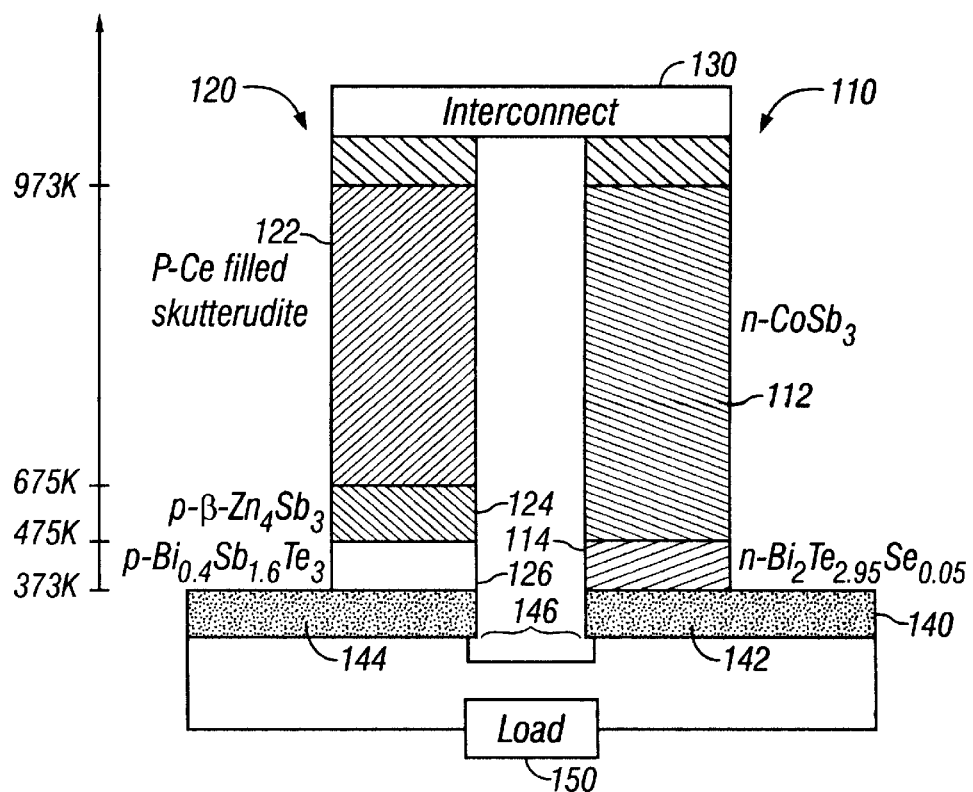
FIG. 1 shows a segmented unicouple.

An embodiment is shown in FIG. 1. The FIG. 1. embodiment shows a segmented unicouple formed of the materials described above with a 973 degree K hot side and a 300 degree K cold side. Each segment preferably has the same current and/or heat flow as other segments in the same leg, or currents and/or heat flows within 10% of others in the same leg. A profile is defined which keeps interface temperatures at their desired level. In order to do this, the geometry of the legs is optimized. Each of the two legs 110, 120 may have a number of segments, at least one, more preferably two segments. For example, the leg 110 include segments 112 and 114. The segment 112 is formed of the N type material $CoSb_3$. The segment 114 is formed of the N type material $Bi_2Te_{2.95}Se_{0.05}$. The length of segment 112 is different than the length of segment 114. Correspondingly, the leg 120 which is formed of P type materials includes a first segment 122 of P type Ce filled skutterudite, a second section 124 of $\rho$-$Zn_4Sb_3$ and a third section 126 of $Bi_{0.4}Sb_{1.6}Te_3$. The ratio between the different sections is approximately 0.620.5: 2.7 for the P type legs 122, 124, 126, and 0.5: 3.3 for the N type legs 112, 114 for a 975K hot side and a 300K cold side temprature of operation. The top thermoelectric materials segments can also be bonded to a top metallic segment with a thickness between 100 microns and 2 mm shown as 130 in FIG. 1) and can be made out of a metal such as Ti or Nb for example.

A cold side of the material includes the two Bite based materials, specifically $Bi_2Te_{2.95}Se_{0.05}$ and $Bi_{0.4}Sb_{1.6}Te_3$. The cold side is located on the bottom of FIG. 1. The cold side is coupled to a cold shoe 140, which includes two different electrically insulated portions 142 and 144. A heat sink, shown generically in 146, may be coupled to the cold end to dissipate heat. The electrical connection to the leg power is a load shown as 150.

The hot side interconnect, at the top of FIG. 1, is connected to conducting part 130 which may electrically connect the P and N legs. This may be connected to a heater (not shown), or placed in the location of waste or exhaust to recover the electricity from the waste heat.

In addition, the ratio of the cross-sectional area between the N type leg 110 and P type leg 120 is optimized to account for differences in electrical and thermal conductivity between the two legs. In all of these calculations, the thermoelectric properties may be averaged for the temperature range in which the materials of the segment are used.

The relative lengths of the segments may be adjusted to ensure the energy balance at the interface and optimize the geometry of the segments for different hot side temperatures of operation. If it is assumed that there is no contact resistance between segments, then the device efficiency is not affected by the overall length of the device. Only the relative lengths of the segments then need to be optimized. The total resistance and power output, however, may depend on the overall length and cross-sectional area of the device.

In the real world, contact resistance between the segments may reduce the efficiency. In this embodiment, the contact resistance may be less than 20 u-ohm-cm$^2$ in order to keep the efficiency from being degraded by this contact resistance.

For the bonding that is used herein, contact resistance should be within the above-discussed range, produces a bond which is mechanically stable in operation, and also acts as a diffusion barrier to prevent potential diffusion between the different materials, and has as similar coefficient of temperature expansion or intermediate coefficient of thermal expansion between the materials that it is bonding. The bonding is conducted by compacting by hot pressing, for example, fine powder of two materials with a thin metal interface layer of 10 to 100 $\mu$m in the form of a foil or powder between these materials.

Pressing is conducted, for example in a graphite die using graphite punches in argon atmosphere. For example, Pd may be used as an interface material between $Zn_4Sb_3$ and $Bi_{0.25}Sb_{0.75}Te_{34}$, between $CoSb_3$ and $Bi_2Te_{2.7}Se_{0.3}$ and also between $Zn_4Sb_3$ and Ce filled skutterudite compounds. Brazing the thermoelectric legs to the top metallic interconnect can be conducted using a brazing alloy such as CuAg-ZnSn.

Figure 3:
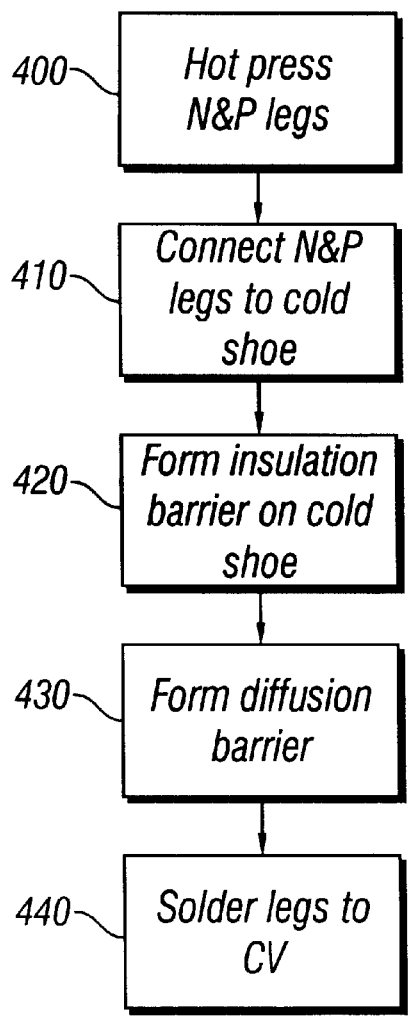
FIG. 3 shows a flowchart of formations.

Fabrication is carried out by fabricating the legs formed of the various thermoelectric materials which can also be topped by a metallic statement. The process is described with reference to the flowchart of FIG. 3.

At 400, each leg is hot pressed to form a complete individual leg in one operation using fine powder of each material. Foils including a noble metal such as Pd or Ti are introduced between the segments. In one embodiment, a Pd foil may be preferred. Hot pressing is done in a graphite die using an argon atmosphere and a temperature of 500° C.

At 410, each of the completed legs of N and P type are connected to a cold shoe. The cold shoe is used for the transfer to the heat sink.

The cold shoe may be a plate such as 140 in FIG. 1, and may be formed of any material which has good heat conducting but insulating properties. The plate for example may be made of Cu-plated alumina. The alumina plate may be 1.5 mm thick, plated with a 100 micron thick Cu layer on both sides. A small Cu strip is etched somewhere on the plate, e.g. in the center of the plate, to electrically insulate the legs at 420. A diffusion barrier material, such as nickel may then be electroplated on both the Cu and the lower segments of the legs at 430. This diffusion barrier may prevent the copper from diffusing into the materials, especially when the materials are based on $Bi_2Te_3$.

At 440, the legs are soldered to the Cu using a special kind of solder such as one formed of BiSn.

A heater may be connected to the top surfaces of the legs forming the hot junction. The heater may be connected using a Cu—Ag—Zn—Sn brazing alloy. The heater may be a special heater, formed of Nb and Ta and a heating element that are electrically insulated from the Nb material.

Figure 2:
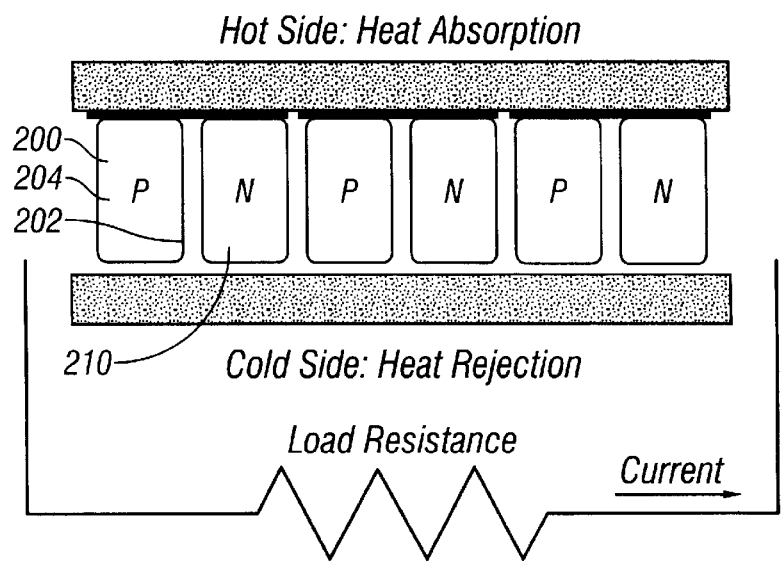
FIG. 2 shows a segmented multileg device.

FIG. 2 shows an alternative system using segmented legs in a multicouple segmented thermoelectric converter. Each leg such as leg 200, is formed of multiple segments shown as 202 and 204. Other legs, such as 210 may be formed having other numbers of segments, and of different materials.

Figure 4:
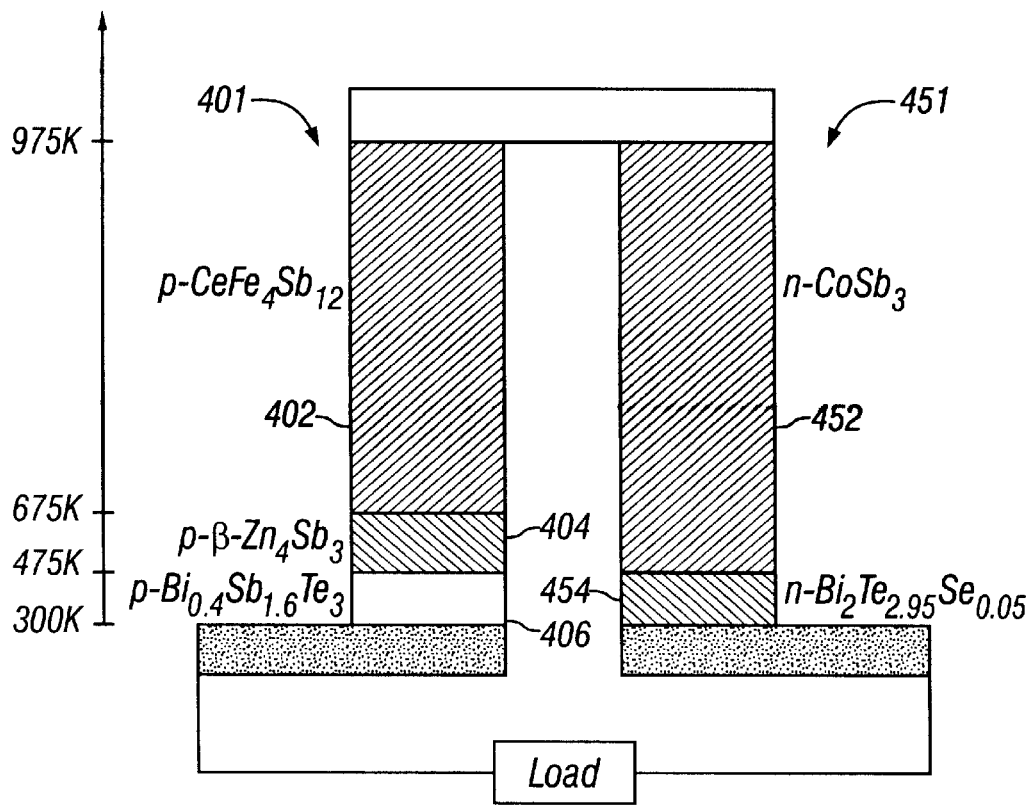
FIG. 4 shows a second embodiment of a segmented device.

Another embodiment is shown in FIG. 4 which has reduced contact resistance. According to this embodiment, similar materials are used, however a slightly colder side temperature may be obtained, e.g., 300 degrees K., with a hot side temperature of 975 degrees K. The segmentation between the various materials may be adjusted to accommodate various hot side temperatures depending on the specific environment that is used. As in the first embodiment, a segmented unicouple is shown in FIG. 4. A plurality of segments are described. Each of the segments has either the same or similar current flow and heat flow as other segments in the same leg.

The unicouple shown in FIG. 4 includes leg 401, and an N type leg 451. Leg 401 includes a first section 402 formed of p type $CeFe_4Sb_{12}$. A second section 404 is formed of p type $\beta$—$Zn_4Sb_3$, and a third section 406 is formed of p type $Bi_{0.4}Sb_{1.6}Te_3$. Correspondingly, the second leg 452. Includes a first section 452 formed of n type $CoSb_3$, and a second section 454 formed of n type $Bi_2Te_{2.95}Se_{0.05}$. Notably, the materials used herein have legs which are formed of Skutterudites only.

The relative lengths of each segment in each leg is adjusted based on differences in thermal conductivity, in order to achieve the desired temperature gradient across each material. The ratio of the cross-sectional area between the n type leg and P type leg are also optimized to account for differences in electrical and thermal conductivity of the legs 450, 452. In an embodiment, Peltier and Thompson contributions, as well as contact resistances, are used in order to optimize and calculate the expected properties of the device. For each segment, the thermoelectric properties are averaged over the temperature range that is used. The relative lengths of the segments are adjusted to ensure heat energy balance at the interface. The length of the segments are optimized to maintain this balance. When using the materials and layout which are provided herein, an efficiency of about 15 percent, but at least 10 percent, can be obtained.

Figure 5:
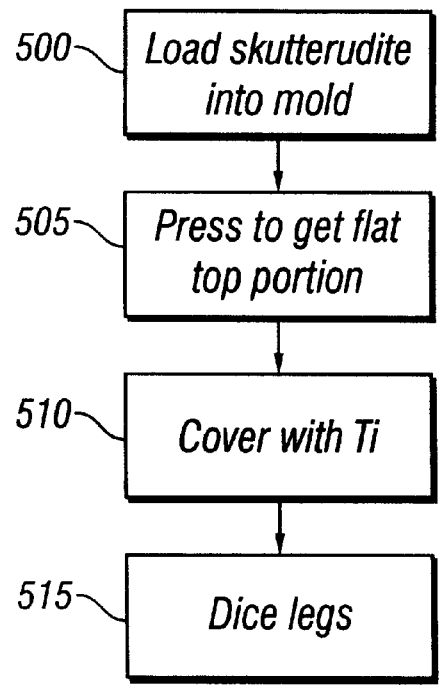
FIG. 5 shows a formation flowchart of the second embodiment.

In operation, the device can be formed according to the flowchart of FIG. 5. Powders of raw material are hot pressed into cylindrical samples of around 8–15 mm; e.g. 12 mm in diameter, within graphite dies, under an inert gas atmosphere such as Argon. In this embodiment, the powders of raw materials are all of Skudderudite alloys such as P type $CeFe_4Sb_{12}$ alloys or n type$CoSb_3$ type alloys. The hot pressing is carried out by loading the thermoelectric material inside the dye at 500. Then the material is cold pressed to achieve a flat interface area at its top portion at 505. The flat interface area is covered with non corrosive conductive powder of about 2 mm thick, for example titanium powder at 510. The sample is then hot pressed for about one hour at a temperature between 500 and 550 degrees C. Another advantage of this system is that both the n type and p type legs can be fabricated identically using this earns system.

The samples are then diced into square legs of approximately 4 mm by four mm using a diamond saw at 515. The lower portion of the legs is then soldered to cold shoes that will be in contact with the cold side of the unicouple. The soldering can be carried out using a BiSn solder material. The top interconnect may braze an Nb metal bridge to the titanium ends of the N legs and P legs. The brazing material that is used may be a $Cu_{22}Ag_{56}Zn_{17}Sn_5$ type alloys. All of the electrical contact resistances between the various contact interfaces were measured, and are maintained below 5 u-ohm-cm$^2$.

Although only a few embodiments have been disclosed in detail above, other modifications are possible. All such modifications are intended to be encompassed within the following claims, in which:

What is claimed is:

1. A method, comprising:

forming an n type thermoelectric material part which has a titanium connection part;

forming a p-type thermoelectric material part which has a titanium connection part; and connecting between the titanium connection parts of the n type thermoelectric material part and the P type thermoelectric material part, to form a contact with a resistance which is less than 5 mc-ohm-cm$^2$;

wherein said forming said n type material and said forming said P type material each comprise obtaining a powder of raw material, forming a flat interface area on said powder, abutting a titanium powder to said flat interface area, and hot pressing said powder, flat interface area and said titanium powder.

2. A method as in claim 1, wherein said connecting uses a $Cu_{22}Ag_{56}Zn_{17}Sn_5$ type brazing material alloy.

3. A method as in claim 1, wherein said n and p type thermoelectric materials are both skutterudite materials.

4. A method as in claim 3, wherein said materials include P type $CeFe_4Sb_{12}$ alloys and n type $CoSb_3$ type alloys.

5. A method as in claim 1, wherein said pressing comprises hot pressing for at least one hour at about 500 degrees C.

6. A method as in claim 5, wherein said pressing comprises pressing in an inert gas atmosphere.

7. A method as in claim 1, wherein said titanium powder is approximately 2 mm thick.

8. A method as in claim 1, wherein said forming an n type leg comprises forming a first leg having at least first and second segments formed of different materials, wherein said first and second segments have different lengths, and each length of each segment is adjusted to provide at least one of a same current and/or a same thermal conductivity across said leg;

and said forming a P type leg comprises forming at least first and second segments formed of different materials and having different lengths, wherein each length of each segment is adjusted to provide at least one of the same current and/or the same thermal conductivity to the segment.

9. A method as in claim 3, wherein each of said n type thermoelectric material parts and said P type thermoelectric material parts are segmented.

10. A method as in claim 9, further comprising operating said unicouple with a 300 degree K cold side and a 975 degree hot side.

* * * * *